(12) United States Patent
Przadka

(10) Patent No.: US 7,459,987 B2
(45) Date of Patent: Dec. 2, 2008

(54) ELECTRICAL ADAPTION NETWORK WITH A TRANSFORMATION LINE

(75) Inventor: Andreas Przadka, Munich (DE)

(73) Assignee: Epcos AG, Munich (DE)

( * ) Notice: Subject to any disclaimer, the term of this patent is extended or adjusted under 35 U.S.C. 154(b) by 219 days.

(21) Appl. No.: 10/575,795

(22) PCT Filed: Sep. 17, 2004

(86) PCT No.: PCT/EP2004/010482

§ 371 (c)(1),
(2), (4) Date: Apr. 13, 2006

(87) PCT Pub. No.: WO2005/038976

PCT Pub. Date: Apr. 28, 2005

(65) Prior Publication Data

US 2007/0126523 A1    Jun. 7, 2007

(30) Foreign Application Priority Data

Oct. 16, 2003    (DE) ............................... 103 48 722

(51) Int. Cl.
*H03H 7/38* (2006.01)
(52) U.S. Cl. ...................................... 333/33
(58) Field of Classification Search ............ 333/33, 333/25, 26; 336/200, 230, 232
See application file for complete search history.

(56) References Cited

U.S. PATENT DOCUMENTS 3,729,694 A * 4/1973 Huntington et al. ........... 333/33
3,754,197 A   8/1973 Cristal
4,949,057 A   8/1990 Ishizaka et al.
5,146,191 A   9/1992 Mandai et al.
5,451,914 A * 9/1995 Stengel ........................ 333/25
5,923,230 A   7/1999 Yoshida et al.
6,133,806 A  10/2000 Sheen
6,407,647 B1 * 6/2002 Apel et al. .................... 333/25

FOREIGN PATENT DOCUMENTS

| EP | 0 837 517 | 1/2004 |
|----|-----------|--------|
| GB | 23 59 780 | 9/2001 |
| JP | 58136108  | 8/1983 |
| JP | 61-015402 | 1/1986 |
| JP | 01143403  | 6/1989 |
| WO | WO03/088410 | 10/2003 |

OTHER PUBLICATIONS

English translation of Written Opinion for PCT/EP2004/010482.

* cited by examiner

*Primary Examiner*—Stephen E Jones
(74) *Attorney, Agent, or Firm*—Fish & Richardson P.C.

(57) ABSTRACT

A network for electrical matching of an electrical component is disclosed. The network includes n first conductor plane and a second conductor plane separated by a ceramic intermediate layer. The network also includes a transformation line formed in or on a substrate and having a predetermined electrical length. The transformation line includes a first part having a bent-over configuration and a second part having a bent-over configuration. The first part is disposed in a first plane and the second part is disposed in a second plane. The second part is electrically connected to the first part by an interlayer contact to the ceramic intermediate layer.

18 Claims, 3 Drawing Sheets

ELECTRICAL ADAPTION NETWORK WITH A TRANSFORMATION LINE

TECHNICAL FIELD

In order to match an electrical component or subassembly to its circuit environment, often one must employ an electrical matching network. Such a device may comprise inductances, capacitances, and transformation lines, and essentially serves to match the impedance of the component to the external environment. Frequently such matching networks are in the form of passive integrated networks wherein the discrete elements forming the network are integrated into (or onto) a substrate; preferably said substrate also serves as the support element for the component of interest. It is possible to fabricate a ceramic component in a ceramic structure, wherewith the matching elements are disposed in or on one or more ceramic bodies of said ceramic structure and are integrated with the component of interest.

BACKGROUND

Electrical transformation lines as components of matching networks are frequently realized in a multilayer ceramic substrate, in which, as mentioned supra, additional elements can be integrated. Transformation lines are employed, e.g., in front-end modules for mobile communications terminal devices, where they may used as components of PIN diode switches, with a requirement of a phase shift of, e.g., c. 90°. Another criterion is that such a transformation line must be optimally matched under conditions of prescribed source and load impedances. In another application, mentioned here as an example, a transformation line is part of a duplexer in a terminal device of a mobile communications system, wherewith said line connects the antenna to the sending path and the receiving path of the terminal device.

Another criterion applied to transformation lines, particularly in terminal devices of mobile communications systems, is minimization of area and space requirements. E.g., in a front-end module, the external dimensions are substantially less than the fraction of the wavelength in the ceramic substrate in which the phase shift is to be accomplished. Because the prescribed phase shift can occur only with a conductor which has a certain geometric length, currently employed transformation lines have a bent-over configuration (e.g. in a zigzag or Greek fret pattern) and often also a multilayer configuration, whereby individual conductor segments overlap, giving rise to capacitive and inductive cross-coupling between different segments of the conductor, as a result of the bent-over configuration as well as of the multilayer configuration. This leads to changes in the matching, and to an additional phase shift beyond that of an ideal line which has the same geometric length but which is configured in a single layer and without bends. Further, the area available, and the position of connecting points (or terminals) at which the transformation line is connected to the component or to the rest of the matching network, cannot be chosen arbitrarily, because these choices depend on the other components of the circuit parts which are being integrated.

An advantageous means of realizing a transformation line is with the use of a so-called "tri-plate" conductor wherein a conductor, e.g. a bent-over (e.g. in a Greek fret pattern) conductor, is laid out between two grounded shielding layers, which are namely metallized plates, with a ceramic layer separating each such shielding layer from the conductor. The distance between the upper and lower grounded shielding plates influences the characteristic impedance, and is chosen accordingly. One cannot arbitrarily choose the thicknesses of the ceramic layers, because technical constraints apply, including the need to integrate with other elements in a common substrate; rather, the said thicknesses must be selected from a limited number of available suitable layer thicknesses, and thus one cannot achieve an optimal matching.

In a known space-saving transmission line, the conductor is laid out in, e.g., a bent-over Greek fret pattern and is realized in two layers. A symmetrical [sic] arrangement of the two planes in which the conductor is laid out is chosen, so that the characteristic impedance of the conductor in the two conductor planes is the same, and corresponds to the impedance of the source and the load. The cross-coupling between the individual segments of the conductor is minimized in that mutually parallel segments of the conductor are sufficiently separated, with the distance between them being as a rule greater than the width of the conductor. The cross-coupling between conductor segments in different conductor planes is reduced in that superposed segments in the two planes are disposed at mutual right angles, or conductor segments in one plane are laid out between the projections of conductor segments from the other plane. In order to increase the phase shift of the transmission line, the geometric length of the conductor may be increased. In situations where the available area is limited, this is only possible if the individual segments of the conductor can be laid out more densely (moved closer together). However, this causes increased cross-coupling of parts of the conductor, detracting from the matching between source and load.

SUMMARY

Accordingly, a network comprising a transformation line which can accommodate other miniaturized components and which is capable of achieving a desired matching of better than 10 dB is disclosed.

In some embodiments, a network is proposed which has a transformation line formed in or (partially) on a substrate, which transformation line is of a predetermined electrical length. In order to better utilize the area available for laying out the transformation line, the transformation line has at least two parts which are bent-over (e.g. laid out in a Greek fret pattern), each of which parts is disposed in a separate conductor plane, wherewith said parts are interconnected by means of interlayer contacting (through-plating). All parts of the transformation line have conductor segments which have straight line shapes and which are mutually joined [sic] at right angles. Preferably, all parts of the transformation line are comprised of segments which exclusively have straight line shapes and which preferably are mutually joined at right angles.

For at least a part of the conductor segments, the following applies: mutually parallel conductor segments disposed in different conductor planes partially overlap and are thereby mutually capacitively coupled, with the capacitive coupling being adjustable by adjusting of individual overlap areas, so as to achieve the prescribed electrical length and prescribed impedance of the transformation line.

The particularly compact, space-saving layout of the conductor in bent-over patterns (e.g. Greek fret patterns), wherewith conductor segments disposed in different conductor planes partially overlap, gives rise to cross-coupling. This cross-coupling tends to be inherently disadvantageous, but is exploited for adjusting the required electrical properties (the predetermined phase shift and the impedance) of the transformation line. In contrast, with known transformation lines, e.g. transformation lines distributed over two planes, the overlapping areas of conductor segments are intentionally kept to a minimum, wherewith the only overlapping is at unavoidable crossing loci of mutually perpendicular segments, and overlapping of mutually parallel conductor segments is avoided.

The network is preferably integrated in a multi-layer component which has a plurality of conductor planes subsumed in the substrate structure, wherewith the matching of the transformation line for a given operating frequency is achieved, and wherewith at this frequency the transformation line converts, e.g., an open circuit at its first end to a short circuit at its second end.

According to some embodiments, the widths of conductor segments in at least one of the conductor planes are different. By appropriate changes of the widths of individual conductor segments, one can influence the capacitive cross-coupling and the impedance of individual conductor segments; thus by appropriate choice of the conductor widths of individual segments one can achieve the desired matching of the conductor impedance. E.g., if one considers two conductor segments which have mutual capacitive and inductive coupling, one can, e.g., reduce the inductive coupling by increasing the width of one of the conductor segments. Moreover, in the same way, by increasing the width of one of the conductor segments, one can increase the parasitic capacitive coupling to neighboring conductor segments (which coupling tends inherently to be detrimental). Thus, by varying the conductor width of a single conductor segment, one can improve the electrical matching of the transmission line. By suitable independent choices of widths of all of the various conductor segments, the matching can be optimized and can be adjusted exactly to a desired value. Typical circuit environments may necessitate, e.g., impedance matching at 50 Ohm.

The disclosed system, device, and/or method enables one to optimize at the desired values, by easy and simple means, electrical matching of the transformation line, and thereby the matching of the entire network for matching of the electrical component of interest, without occasioning a need for increased space to accommodate the transformation line. The disclosed system, device, and/or method facilitates hookups which if attempted with known transmission lines would lead to inadmissibly high cross-coupling and thereby to poor matching. This capability enables further reduction of the required space for accommodating the transmission line, and (alternatively or additionally) enables the transmission line to be configured in a geometric shape which previously was impossible without introducing additional drawbacks allowing one to better utilize the area available on a given substrate. In some embodiments, there is no need for additional space because the geometric length and as a rule also the electrical length of the conductor, which length is a determining factor in the phase shift, are not appreciably changed.

The term "conductor segment" is understood to mean a given element of the conductor, having a given length. As a rule, it is simplest and most convenient, for calculation purposes and generally for the engineering design of the transmission line, to define a "conductor segment" as a segment between two bend points of the bent-over conductor.

The transmission line can be realized with a conductor which has a bent-over configuration in each of two conductor planes (this arrangement is also known with customary transmission lines). The two conductor planes are separated by an insulator which preferably is a ceramic layer. Each conductor plane may be separated from an associated grounded planar shielding plate by another insulating layer, which also may be a ceramic layer.

The transformation line may be in the form of a "tri-plate" line, wherewith the conductor planes are disposed between two grounded plates. The transformation line makes it possible for the insulating layer separating the two conductor planes to be thinner than with known transformation lines. In some embodiments, the resulting detrimental cross-coupling is compensated for. The two parts of the conductor which are laid out in different conductor planes are interconnected by through-plating.

In the two conductor planes the segments are laid out in a manner such that no parallel segments in the two conductor planes are superposed. Parallel segments in the two planes are offset by at least a minimum distance. Crossings of sectors in different conductor planes are preferably at locations distant from the segment ends, particularly preferably in the middle of the conductor segments. When the conductor widths of individual segments are varied, advantageously certain constraints are adhered to. In particular, the widths of the conductor segments and the separation distances of parallel conductor segments are subject to minimum values which are mainly technologically dictated, and which may be selected at, e.g., 100 micron. These exemplary minimum values of width and separation are mentioned as exemplary constraints which can be taken into account in the optimization process and which thus will be reflected in the particular configuration of the transformation line which is used in practice. Other constraints and minimum values may be applicable and may be taken into account.

The geometric length of the conductor of the transformation line is selected such that the electrical length of the conductor corresponds to that of a lambda/4 line. In many instances a lambda/4 line is needed where the circuit state must be changed from "short" to "open". However, the phase shift of the transformation line in an inventive network may give rise to a phase shift other than lambda/4.

A preferred impedance match occurs at 50 Ohm, because this value is required by many circuit environments. However, it is possible that the transformation line and accordingly the network may be matched to other circuit environments other than 50 Ohm. In a "tri-plate" line, the impedance matching can be accomplished by changing the distances between the shielding plates and the conductor planes. It is also possible, when the available layer thicknesses in a given substrate are not sufficient to achieve a desired impedance, to carry out an additional separate impedance transformation [sic] and to provide a corresponding element in the network.

The inventive network is preferably integrated into a multilayer ceramic structure, preferably an LTTC (low temperature co-fired ceramic) [sic—i.e. LTCC], which is optimized, e.g., for minimal shrinkage. Such a low-shrink ceramic in an LTTC embodiment [(i.e. LTCC embodiment)] allows high integration of network elements, and possibly also allows integration of the components of interest into the ceramic, because with this technology one can produce a highly engineered ceramic and a low-loss conductor, with exactly reproducible component geometry and network geometry. Ordinarily the substrate for the network is also the support for the component of interest, wherewith the component is physically mounted on said support and is electrically bonded on said support, e.g. in a single step by means of an SMD process (conventional surface-mounted device techniques). If the component of interest is a component which operates with acoustic waves, one may choose, e.g., a "flip-chip" arrangement.

The substrate for the network, which network may be an integrated network, may simultaneously serve as the substrate for a module in which a plurality of components and the associated network(s) are integrated.

The invention, and a method of optimization of an inventive network, will be described in more detail hereinbelow, with reference to exemplary embodiments and the accompanying drawings.

DECSRIPTION OF THE DRAWINGS

DETAILED DESCRIPTION

Figure 1:
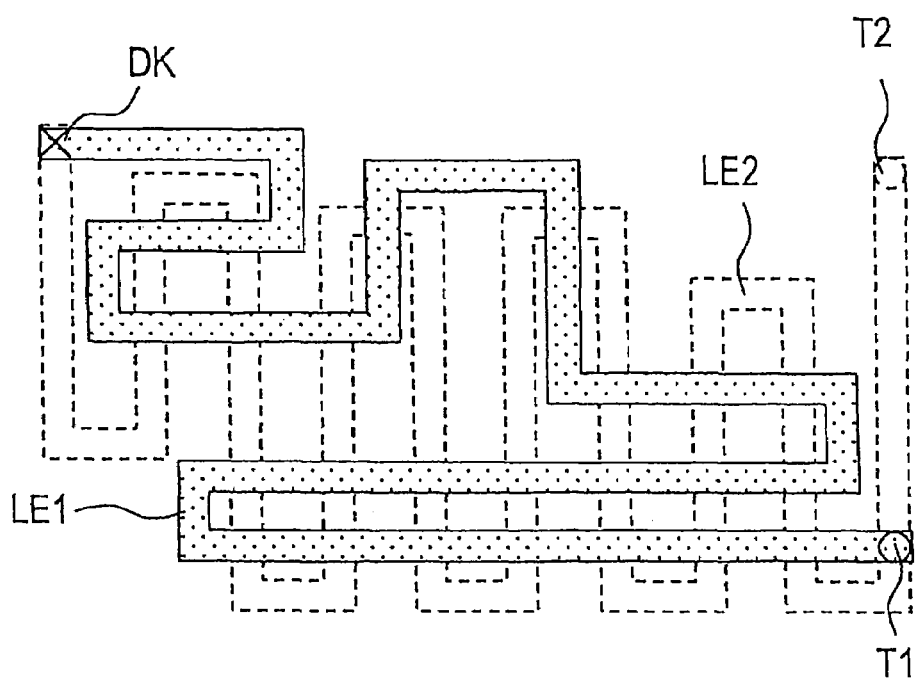
FIG. 1 is a schematic plan view of a conductor of a known transmission line, which conductor has a bent-over configuration (e.g. laid out in a Greek fret pattern) and is arranged so as to be disposed in two planes.

A known transmission line will be described, with reference to FIGS. 1 and 2. These Figures are not necessarily drawn with correct dimensional proportions—the Figures serve only for purposes of basic description. The known "tri-plate" arrangement comprises a first and a second conductor plane (LE1, LE2), separated by a ceramic intermediate layer. Also provided, above and below the first and second conductor planes, are respective shielding plates (ME1, ME2), also separated from the respective conductor planes by respective ceramic intermediate layers. Each of the shielding plates (ME1, ME2) has, e.g. at least one layer of a metal coating or bonded metal (see FIG. 2); and both ME1 and ME2 are connected to ground. The conductor planes and the shielding plates are preferably disposed mutually symmetrically, thus the distance between each shielding plate ME and its neighboring conductor plane LE is the same, "dE". The distance dE may be different from the distance "dL" separating the two conductor planes (LE1, LE2). E.g., in a known transmission line dE=125 micron, and dL=95 micron. FIG. 1 shows the bent-over configuration of the conductor LE1 in the first conductor plane, and shows in dotted lines (in projection) the bent-over configuration of the conductor LE2 in the second conductor plane. The conductors are each comprised of straight segments which are joined [sic] at right angles. The segments in the two conductor planes (LE1, LE2) are mutually arranged such that no parallel segments are directly superposed. The two parts (LE1, LE2) of the overall conductor in the respective planes are interconnected by means of interlayer contacting (so-called "through-plating"), DK. The conductor (transmission line) is connected to an external circuit environment, e.g., the network or some component, via the two terminal points (T1, T2). The conductor has a uniform width d0.

Figure 3:
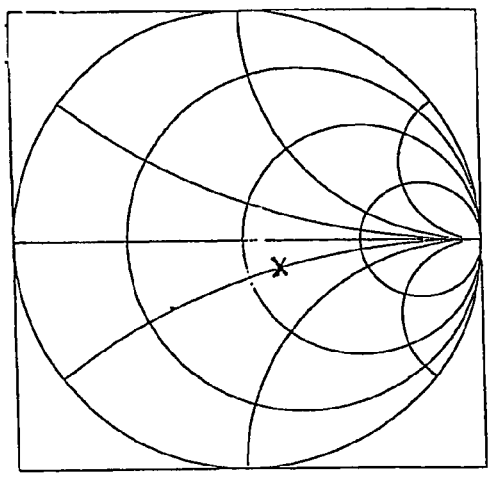
FIG. 3 illustrates a Smith chart of a known transmission line.

FIG. 3 shows a Smith chart indicating the matching computed from this known transmission line. The matching of the known transmission line is clearly inferior to 15 dB; the impedance matching is approximately 35 Ohm.

In some aspects, the width of individual conductor segments in one or both of the conductor planes (LE1, LE2) is varied, and in particular is increased. In this way, the cross-coupling of the conductor segments (A1 to A6) with neighboring conductor segments in the same conductor plane or in the other conductor plane (conductor plane LE2 disposed below plane LE1 and not shown in FIG. 4) is reduced, and/or is changed in character. For example, by broadening a conductor segment A the inductive cross-coupling can be reduced, while at the same time the capacitive cross-coupling is increased. The widths shown (d3, d4, d5, d6) of respective conductor segments (A3, A4, A5, A6) are provided merely for purposes of example. The supposed "original" width of a conductor is d0. For optimal matching of the conductor, under normal circumstances the widths dx of all varied conductor segments Ax will have mutually differing values. However, it is also possible that individual conductor segments will have the same width, particularly in the conductor segments which are unchanged with respect to the original structure. Only the conductor plane LE1 is shown in FIG. 4; the second conductor plane LE2 disposed below plane LE1 can be (and is) changed correspondingly, wherewith the conductor segments in that plane also have differing widths.

Figure 5:
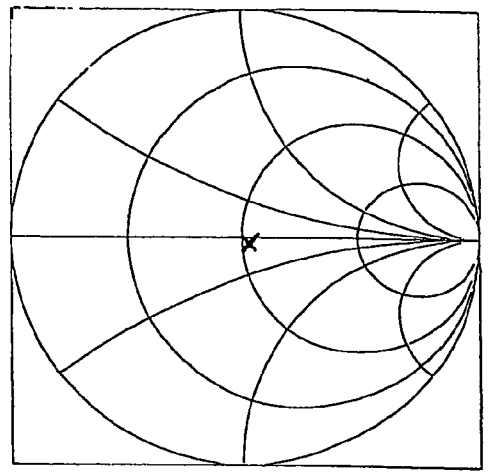
FIG. 5 illustrates a Smith chart of the transmission line.
Figure 4:
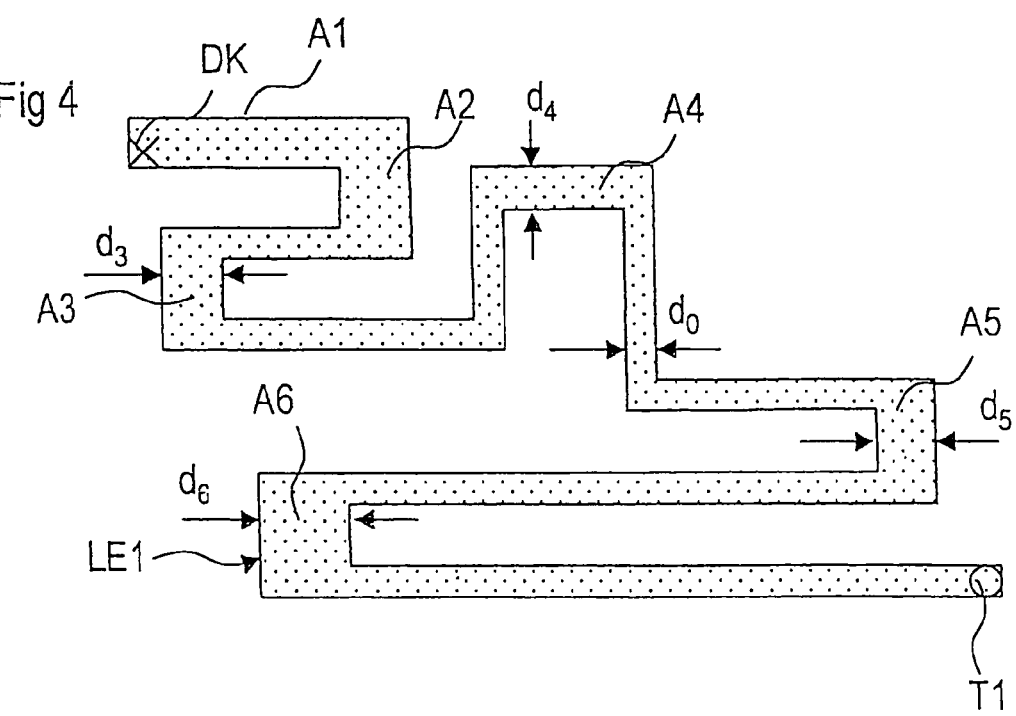
FIG. 4 is a schematic plan view of a part of an transmission line.

FIG. 5 shows the Smith chart associated with the transmission line illustrated in FIG. 4. It is seen by comparison with FIG. 3 that the electrical matching of the transmission line is significantly improved. It is at approximately 50 Ohm and has a phase shift of, e.g., exactly lambda/4. The magnitude of the phase shift can be changed by appropriately increasing or decreasing the geometric and therefore electrical lengths of the conductor in one or both planes. Thus a phase shift different from lambda/4 is possible.

The following is a possible method of optimizing the matching of a transmission line. One starts with a conductor having segments of equal width, the electrical characteristics of which conductor are calculated or simulated. Then the width of a segment is varied and the electrical characteristics are re-calculated. The effect obtained (shifting of the matching, as a vector in the Smith chart), is stored, as a measurement of the matching corresponding to the change in the segment. Then, beginning with the starting structure, the width of a different segment is changed, and the electrical characteristics are again calculated, leading to a second determination of the matching. Depending on the problem posed, and effects obtained from the individual variations, it may be possible to achieve the desired (or required) matching by interpolating between the effects (and corresponding variations of the widths) of just two individual segments. For more difficult matching situations, it may be necessary to implement additional changes, for other segments or for all segments, and, using the calculated changes in the matching, to arrive at the desired matching via a combination of individual changes. For such a resulting structure, it may be necessary to employ still further adjustments, because individual calculated adjustments may have interactive effects.

A network with the novel transformation line can be used for matching of any arbitrary electrical components. It can be advantageously used for passive integrated networks, which is needed for further miniaturization of electrical components. A particularly advantageous application for the network [is] in electrical matching of components of front-end modules in terminal devices in wireless communications systems, e.g. in mobile telephone handsets. In such applications, the passive integration [sic—i.e. passive network] must be integrated into the component substrate or front-end module substrate, in order to achieve the desired (or already established) external dimensions.

Figure 2:
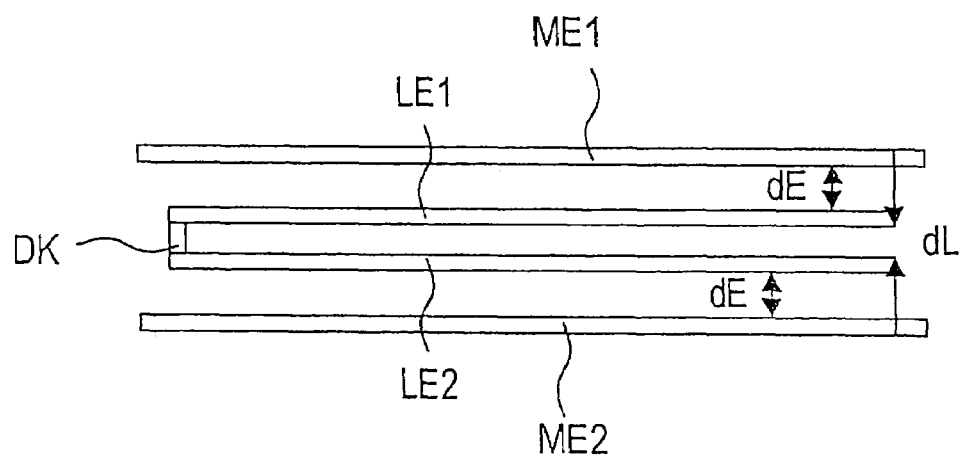
FIG. 2 is a schematic cross sectional view of a transmission line in the form of a "tri-plate line".

For accommodation of additional network components and for fulfillment of its function as a substrate for components, the substrate may be enlarged by adding additional layers beyond the sequence of layers illustrated in FIG. 2. The thickness of the substrate and the number of layers needed for it depends on the number of network elements and components which are to be integrated into said substrate. The material selected for the corresponding layers of the substrate ceramics depends on the components to be realized in said substrate ceramics.

In the present case, an electrically insulating ceramic material is used for the intermediate layer between the two conductor planes (LE1, LE2); the (preferably) low dielectric constant of the ceramic material is a factor in determining the impedance of the conductor. A lower dielectric constant of the intermediate layer also reduces the cross-coupling between the conductor planes. The arrangement allows such cross-coupling to be minimized, or to be advantageously exploited. Also, the ceramic layer(s) between a given conductor plane LE1 and a shielding plate E1 which shielding plate is connected to ground is (are) selected and disposed so as to be electrically insulating; here again the value(s) of the dielectric constant(s) has (have) an influence. Typically, the same ceramic material will be used for all of the ceramic layers, including the intermediate layer. In some embodiments however, it is possible for the intermediate layer to be comprised of a different ceramic material from that of the other ceramic layers, in order to be able to, e.g., set the cross-coupling (which may be desirable in some instances) to the desired value.

The areas available for the individual components are generally determined by interlayer contacting points, and by the other elements present or realized in the same plane. This enables particularly good matching for an area which is available and has any given form and shape.

Figure 6:
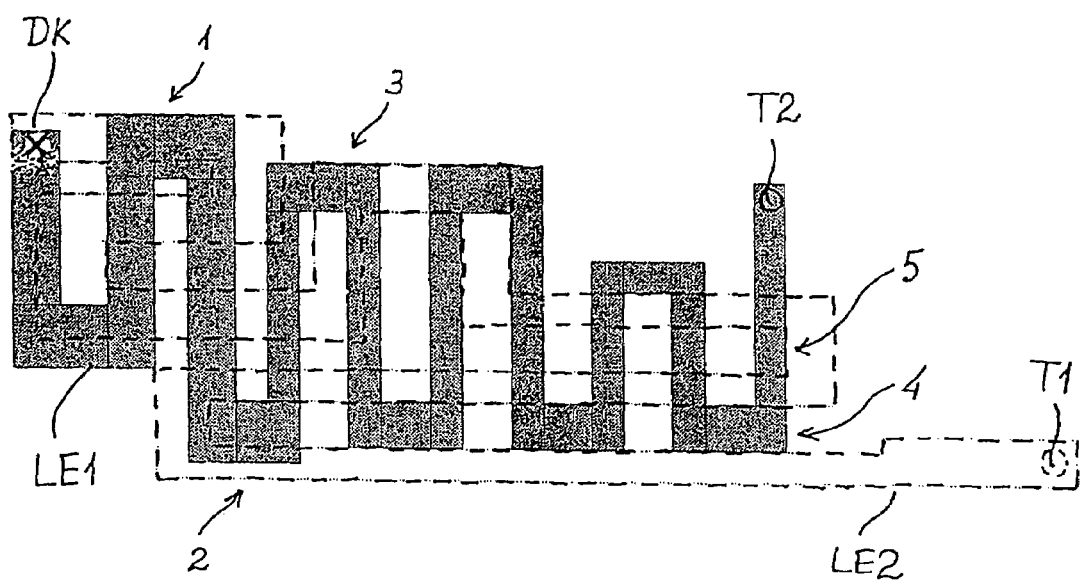
FIG. 6 is a schematic plan view of two parts of a transmission line, each of which is disposed in its own conductor plane, wherewith the two planes are superposed one above the other.

FIG. 6 is a schematic plan view of two parts of a transmission line, which parts are disposed in respective superposed conductor planes (LE1, LE2). The interconnection of the parts of the transformation line corresponds to that of FIG. 1. There are mutually parallel superposed regions 1, 2, and 3; the area of overlap is adjusted such that at a particular operating frequency the transformation line is electrically matched at, e.g., a phase shift of 180☐ and an impedance of 50 Ohm.

In this exemplary embodiment, the overlapping area is arrived at not only by a suitable disposition (shifting in the x and y directions) but also by [adjusting] the widths of the corresponding conductor segments. Conductor segments of different widths have different impedances, and this fact is utilized for adjusting the impedance of the overall conductor.

In region 4 there is in fact no overlapping of parallel conductor segments. However, the conductor segments in the different conductor planes directly adjoin each other in a projection plane, and are cross-coupled via an electrical dispersion field. In contrast, in the case of the known conductor illustrated in FIG. 1, a certain distance is provided between the mutually parallel segments, to avoid parasitic capacitive coupling.

It is possible that only one longitudinal edge of a conductor segment adjoins (in a projection plane) the longitudinal edge of a parallel conductor segment in the other conductor plane (see region 5). It is also possible (as in region 4, for example) for a conductor segment to be disposed such that both edges of the conductor segment adjoin (in a projection plane) the longitudinal edges of parallel conductor segments in the other conductor plane.

Also possible, in a refinement of the embodiments described herein (not illustrated), is for the conductor to have a uniform width over its entire length, wherewith the overlapping areas of mutually parallel conductor segments which are disposed in different conductor planes and which segments partially overlap are determined solely by the mutual displacements of said segments.

The invention claimed is:

1. A network comprising:
   a first conductor plane and a second conductor plane;
   a substrate; and
   a ceramic intermediate layer that separates the first conductor plane and the second conductor plane, the ceramic intermediate layer comprising an interlayer contact;
   a transformation line formed in or on the substrate and having a predetermined electrical length, the transformation line comprising;
      a first part having a bent-over configuration, the first part being disposed in the first conductor plane; and
      a second part having a bent-over configuration, the second part being disposed in the second conductor plane, the second part being electrically connected to the first part by the interlayer contact;
   wherein the first and second parts of the transformation line comprise conductor segments that are straight and that are joined at right angles;
   wherein at least some of the conductor segments comprise parallel conductor segments disposed in the first and the second conductor planes, the parallel conductor segments at least partially overlapping and being capacitively coupled such that a resulting capacitive coupling is adjustable by adjusting overlap areas of the parallel conductor segments; and
   wherein widths of conductor segments in at least one of the first and second conductor planes are different and the widths are configured to compensate for cross-couplings between different segments, and to generate an impedance matching to an environment greater than about 25 dB.

2. The network of claim 1, further comprising:
   a first shielding plate connected to ground; and
   a second shielding plate connected to ground, the second shielding plate being about parallel to the first shielding plate, wherein at least one of the first and second conductor planes is between the first and second shielding plates and is separated from at least one of the first shielding plate and the second shielding plate by at least one ceramic layer.

3. The network of claim 1, wherein at least one longitudinal edge of at least one parallel conductor segment disposed in the first conductor plane adjoins at least one longitudinal edge of at least one parallel conductor segment in the second conductor plane, the at least one conductor segment in the first conductor plane being about parallel to the at least one conductor segment in the second conductor plane.

4. The network of claim 1, wherein the transformation line comprises a "tri-plate" line and includes first and second shielding plates, wherein the first and second shielding plates are connected to ground.

5. The network of claim 1, wherein the transformation line is a lambda/4 line.

6. The network of claim 1, wherein the transformation line has 50 Ohm impedance matching.

7. The network of claim 1, further comprising an element configured to provide impedance matching to a desired value.

8. The network of claim 1, wherein the bent-over configuration of the first part and the second part of the transmission line is a Greek fret pattern.

9. The network of claim 1, wherein the interlayer contact comprises through-plating.

10. The network of claim 1, wherein the parallel conductor segments are configured such to generate the predetermined electrical length and predetermined impedance of the transformation line.

11. The network of claim 1, wherein the substrate is a multilayer ceramic structure.

12. The network of claim 11, wherein the multilayer ceramic structure is configured to provide support for a component or a module.

13. The network of claim 12, wherein the component or module comprises at least one component configured to operate with acoustic waves.

14. A network comprising:
a first conductor plane and a second conductor plane;
a substrate; and
a ceramic intermediate layer that separates the first conductor plane and the second conductor plane, the ceramic intermediate layer comprising an interlayer contact;
a transformation line formed in or on the substrate and having a predetermined electrical length, the transformation line comprising:
a first part having a bent-over configuration, the first part being disposed in the first conductor plane; and
a second part having a bent-over configuration, the second part being disposed in the second conductor plane, the second part being electrically connected to the first part by the interlayer contact;
wherein the first and second parts of the transformation line comprise conductor segments that are straight and that are joined at right angles;
wherein at least some of the conductor segments comprise parallel conductor segments disposed in the first and the second conductor planes, the parallel conductor segments at least partially overlapping and being capacitively coupled such that a resulting capacitive coupling is adjustable by adjusting overlap areas of the parallel conductor segments; and
wherein all of the conductor segments have a width greater than or equal to a length of a conductor segment having a shortest length.

15. The network of claim 14, wherein widths of conductor segments in at least one of the first and second conductor planes are different and the widths are configured to compensate for cross-couplings between different segments, and to generate an impedance matching to an environment greater than about 25 dB.

16. A network comprising:
a first conductor plane and a second conductor plane;
a substrate; and a ceramic intermediate layer that separates the first conductor plane and the second conductor plane, the ceramic intermediate layer comprising an interlayer contact;
a transformation line formed in or on the substrate and having a predetermined electrical length, the transformation line comprising;
a first part having a bent-over configuration, the first part being disposed in the first conductor plane; and
a second part having a bent-over configuration, the second part being disposed in the second conductor plane, the second part being electrically connected to the first part by the interlayer contact;
wherein the first and second parts of the transformation line comprise conductor segments that are straight and that are joined at right angles;
wherein at least some of the conductor segments comprise parallel conductor segments disposed in the first and the second conductor planes, the parallel conductor segments at least partially overlapping and being capacitively coupled such that a resulting capacitive coupling is adjustable by adjusting overlap areas of the parallel conductor segments; and
wherein widths of parallel conductor segments in one of the first and second conductor planes and of respective parallel conductor segment in the other of the first and second conductor planes are different and the widths are configured to compensate for cross-couplings between different segments and to generate an impedance matching to an environment to the extent of greater than 25 dB.

17. The network of claim 16, wherein the width of different ones of the parallel conductor segments is different.

18. A network comprising:
a first conductor plane and a second conductor plane;
a substrate;
a ceramic intermediate layer that separates the first conductor plane and the second conductor plane, the ceramic intermediate layer comprising an interlayer contact;
a transformation line formed in or on the substrate and having a predetermined electrical length, the transformation line comprising;
a first part having a bent-over configuration, the first part being disposed in the first conductor plane; and
a second part having a bent-over configuration, the second part being disposed in the second conductor plane, the second part being electrically connected to the first part by the interlayer contact;
a first shielding plate connected to ground; and
a second shielding plate connected to ground, the second shielding plate being about parallel to the first shielding plate, wherein at least one of the first and second conductor planes is between the first and second shielding plates and is separated from at least one of the first shielding plate and the second shielding plate by at least one ceramic layer;
wherein the first and second parts of the transformation line comprise conductor segments that are straight and that are joined at right angles;
wherein at least some of the conductor segments comprise parallel conductor segments disposed in the first and the second conductor planes, the parallel conductor segments at least partially overlapping and being capacitively coupled such that a resulting capacitive coupling is adjustable by adjusting overlap areas of the parallel conductor segments;
wherein the transformation line comprises a "tri-plate" line and includes the first and second shielding plates; and
wherein a thickness of the ceramic layers is about the same as a thickness of the shielding plates.

* * * * *

UNITED STATES PATENT AND TRADEMARK OFFICE
CERTIFICATE OF CORRECTION

PATENT NO. : 7,459,987 B2
APPLICATION NO. : 10/575795
DATED : December 2, 2008
INVENTOR(S) : Andreas Przadka It is certified that error appears in the above-identified patent and that said Letters Patent is hereby corrected as shown below:

Title Page, Column 1, (54) and col. 1, title, line 1, delete "ADAPTION" and insert --ADAPTATION--.

Title Page, Column 2, (57), ABSTRACT, line 2, delete "includes n first" and insert --includes a first--.

Title Page, Column 2, (57), ABSTRACT, line 11, delete "to" and insert --in--.

Signed and Sealed this

Seventeenth Day of February, 2009

JOHN DOLL
*Acting Director of the United States Patent and Trademark Office*